(12) United States Patent
Jung et al.

(10) Patent No.: US 8,933,430 B1
(45) Date of Patent: Jan. 13, 2015

(54) VARIABLE RESISTANCE MEMORY DEVICE AND METHOD OF MANUFACTURING THE SAME

(71) Applicant: SK Hynix Inc., Gyeonggi-do (KR)

(72) Inventors: Ha Chang Jung, Gyeonggi-do (KR); Gi A Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/044,367

(22) Filed: Oct. 2, 2013

(30) Foreign Application Priority Data

Jul. 11, 2013 (KR) .......................... 10-2013-0081559

(51) Int. Cl.
*H01L 47/00* (2006.01)
*H01L 45/00* (2006.01)

(52) U.S. Cl.
CPC ........ *H01L 45/1683* (2013.01); *H01L 45/1253* (2013.01)
USPC .......... 257/4; 257/42; 257/295; 257/E21.068; 438/3; 438/95; 438/102

(58) Field of Classification Search
CPC ....... H01L 29/08; H01L 21/28; H01L 27/115; H01L 21/00; H01L 21/02
USPC ............... 257/42, E21.068, 295; 438/95, 102
See application file for complete search history.

(56) References Cited

U.S. PATENT DOCUMENTS

| | | | | |
|---|---|---|---|---|
| 7,511,297 B2 * | 3/2009 | Jang et al. | ........................ | 257/42 |
| 7,671,360 B2 | 3/2010 | Sato et al. | | |
| 7,888,155 B2 * | 2/2011 | Chen | ................................ | 438/54 |
| 7,964,498 B2 * | 6/2011 | Kum | ............................. | 438/652 |
| 8,049,199 B2 * | 11/2011 | Eun et al. | ........................... | 257/4 |
| 8,080,440 B2 * | 12/2011 | Lai et al. | .......................... | 438/95 |
| 8,637,843 B2 * | 1/2014 | Asano | ................. | 257/2 |
| 8,748,958 B1 * | 6/2014 | Lee et al. | ...................... | 257/295 |
| 2006/0175597 A1 * | 8/2006 | Happ | ................................ | 257/2 |
| 2007/0023857 A1 * | 2/2007 | Jin et al. | ......................... | 257/510 |
| 2007/0051936 A1 * | 3/2007 | Pellizzer et al. | ................... | 257/4 |
| 2008/0029752 A1 * | 2/2008 | Karpov et al. | ..................... | 257/2 |
| 2008/0135824 A1 * | 6/2008 | Lai et al. | ............................ | 257/2 |
| 2008/0157053 A1 * | 7/2008 | Lai et al. | ............................ | 257/4 |
| 2008/0266940 A1 * | 10/2008 | Lai et al. | ........................... | 365/163 |
| 2008/0272355 A1 * | 11/2008 | Cho et al. | .......................... | 257/2 |
| 2010/0117046 A1 * | 5/2010 | Chang et al. | ...................... | 257/3 |
| 2011/0012079 A1 * | 1/2011 | Chen | ................................ | 257/2 |
| 2011/0073826 A1 * | 3/2011 | Lee et al. | ........................... | 257/3 |
| 2012/0156851 A1 * | 6/2012 | Lee et al. | ...................... | 438/382 |
| 2012/0313071 A1 * | 12/2012 | Gopalan | ........................... | 257/4 |

FOREIGN PATENT DOCUMENTS

KR 1020090069772 7/2009

* cited by examiner

*Primary Examiner* — Caleb Henry
(74) *Attorney, Agent, or Firm* — IP & T Group LLP

(57) ABSTRACT

A variable resistance memory device and a method of manufacturing the same are provided. The variable resistance memory device includes a multi-layered insulating layer including a plurality of holes formed on a semiconductor substrate, a lower electrode formed in a bottom of each of the holes, a first spacer formed on the lower electrode and a sidewall of each of the holes, a second spacer formed on an upper sidewall of the first spacer, a third spacer formed on a lower sidewall of the first spacer below the second spacer, a variable resistance part that is formed on the lower electrode has a height lower than a height of a top of each hole, and an upper electrode formed on the variable resistance part to be buried in each hole.

12 Claims, 4 Drawing Sheets

VARIABLE RESISTANCE MEMORY DEVICE AND METHOD OF MANUFACTURING THE SAME

CROSS-REFERENCES TO RELATED APPLICATION

This application claims priority under 35 U.S.C. 119(a) to Korean application number 10-2013-0081559, filed on Jul. 11, 2013, in the Korean Patent Office, which is incorporated by reference in its entirety.

BACKGROUND OF THE INVENTION

1. Technical Field

Various embodiments of the inventive concept relate to a nonvolatile memory device, and more particularly, to a variable resistance memory device and a method of manufacturing the same.

2. Related Art

In recent years, with demands on semiconductor devices with high performance and low power, next generation semiconductor memory devices with non-volatility and non-refresh have been researched. As one of the next-generation semiconductor memory devices, variable resistance memory devices are suggested. Examples of the variable resistance memory devices includes random access memory devices (PCRAMs), resistive RAMs (ReRAMs), magnetic RAMs (MRAMs), spin-transfer torque magnetoresistive RAMs (STTMRAMs), and polymer RAMs (PoRAMs).

The variable resistance memory devices perform a memory operation to have a set state or a reset state by controlling a phase-change material, which constitutes a data storage unit, to a crystalline state or an amorphous state.

Attempts to reduce a reset current, that is, a current required to switch a phase-change material to an amorphous state in PCRAMs have been made. Reduction in the reset current of the PCRAMs may be determined by a resistance of the phase-change material layer and a contact area between a lower electrode and the data storage unit.

Thus, at present, attempts to reduce the contact area between the lower electrode and the data storage unit, which may be controlled by a process, have been made increasingly.

SUMMARY

In an embodiments are provided to a variable resistance memory device capable of reducing a reset current, and a method of manufacturing the same.

According to one aspect of an exemplary embodiment, there is provided a variable resistance memory device. The variable resistance memory device may include a multi-layered insulating layer including a plurality of holes formed on a semiconductor substrate, a lower electrode formed in a bottom of each of the holes, a first spacer formed on the lower electrode and a sidewall of each of the holes, a second spacer formed on an upper sidewall of the first spacer, a third spacer formed on a lower sidewall of the first spacer below the second spacer, a variable resistance part that is formed on the lower electrode has a height lower than a height of a top of each hole, and an upper electrode formed on the variable resistance part to be buried in each hole.

According to an aspect of an exemplary embodiment, there is provided a method of manufacturing a variable resistance memory device. The method may include forming a multi-layered insulating layer on a semiconductor substrate, forming a hole exposing a portion of an upper surface of the semiconductor substrate by etching the multi-layered insulating layer, forming a lower electrode in a bottom of the hole, forming a first spacer on the lower electrode and a sidewall of the hole, forming a second spacer on an upper sidewall of the first spacer, forming a third spacer on a lower sidewall of the first spacer, forming a variable resistance part in the hole to have a height lower than that of the hole, and forming an upper electrode on the variable resistance part to be buried in the hole.

According to an aspect of an exemplary embodiment, there is provided a method of manufacturing a variable resistance memory device. The method may include forming a multi-layered insulating layer on a semiconductor substrate, forming a hole exposing a portion of an upper surface of the semiconductor substrate by etching the multi-layered insulating layer, forming a lower electrode in a bottom of the hole, forming a first spacer on the lower electrode and a sidewall of the hole, forming a second spacer protruded from an upper sidewall of the first spacer, depositing a third spacer material into the hole, forming a third spacer on a lower sidewall of the first spacer and below the second spacer by selectively etching the third spacer material, forming a variable resistance part in the hole to have a height lower than that of the hole.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
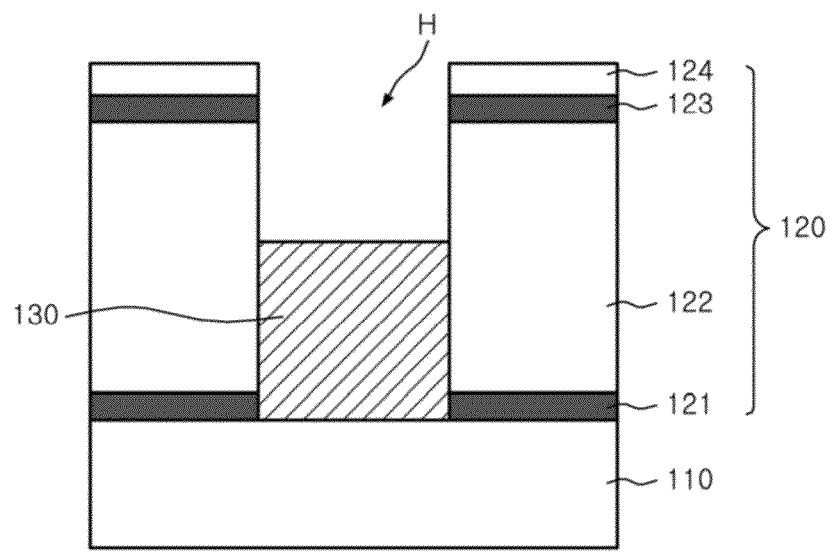
FIGS. 1 to 8 are views illustrating a method of manufacturing a variable resistance memory device according to an embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. In addition, a singular form may include a plural form as long as it is not specifically mentioned in a sentence.

As illustrated in FIG. 1, an insulating layer 120 is formed on a semiconductor substrate 110, and a hole H is formed in the insulating layer 120. A conductive material is gap-filled in the hole H, and recessed using a Cl⁻ or F⁻-based etching gas to form a lower electrode 130 having a certain height in a bottom of the hole H. In the embodiment, although not shown, the semiconductor substrate 110 may include a word line and a switching device. In the embodiment, the insulating layer 120 may be a multi-layered insulating layer including a nitride layer 121 formed on the semiconductor substrate 110, an oxide layer 122 formed on the nitride layer 121, a buffer nitride layer 123 formed on the oxide layer 122, and a buffer oxide layer 124 formed on the buffer nitride layer 123.

Figure 2:
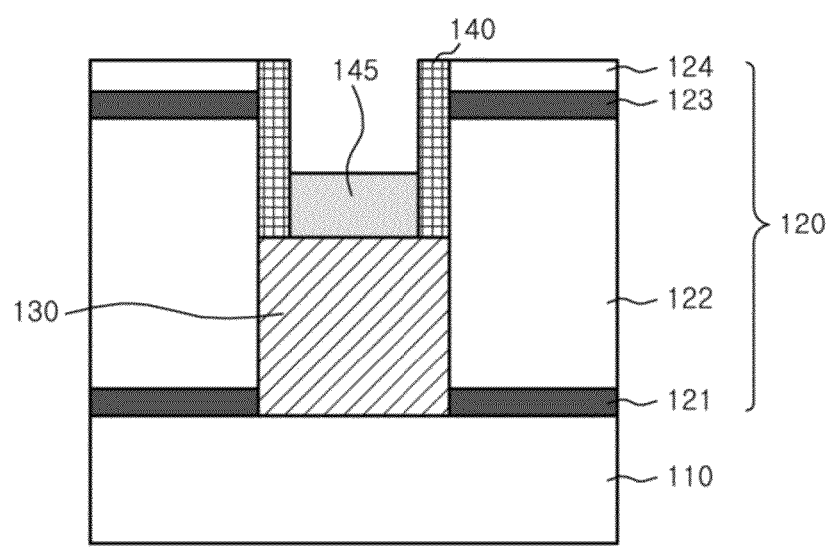

As illustrated in FIG. 2, a polysilicon material is deposited to be buried in the hole H in which the lower electrode 130 is formed, and then the polysilicon material is etched back to remain only on a sidewall of the hole H to form a first spacer 140. At this time, the etch back process may be performed using HBr gas, which may prevent the lower electrode 130 from being lost. A nitride layer is deposited to be buried in the hole H in which the first spacer 140 is formed and then recessed to form a sacrificial layer 145 having a certain height on the lower electrode 130. The sacrificial layer 145 may be formed through a wet etch method.

Figure 3:
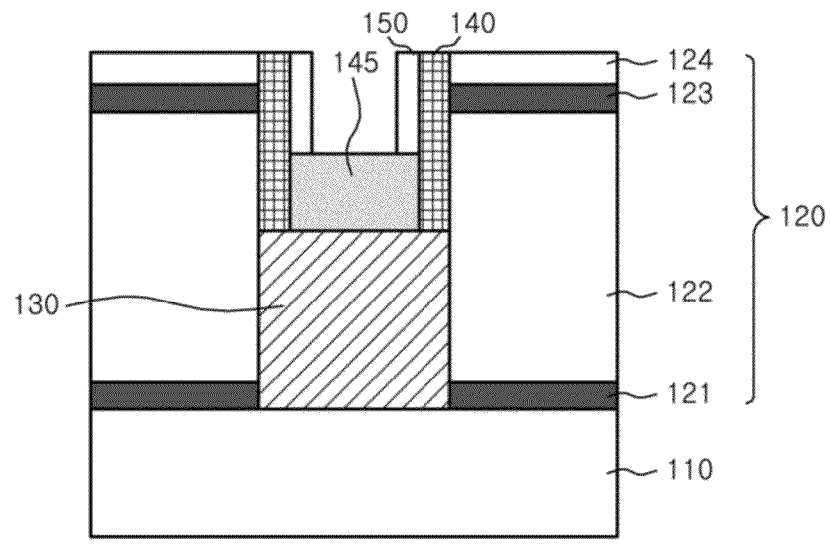

As illustrated in FIG. 3, the first spacer 140 formed on the sidewall of the hole H is selectively oxidized to form a second spacer 150 on a sidewall of the first spacer 140.

Figure 4:
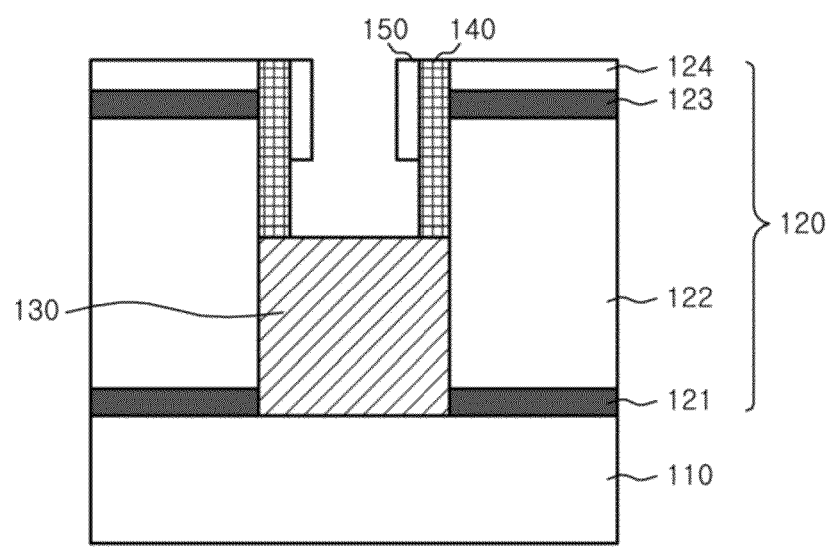

As illustrated in FIG. 4, the sacrificial layer 145 formed in the hole H is removed.

Figure 5:
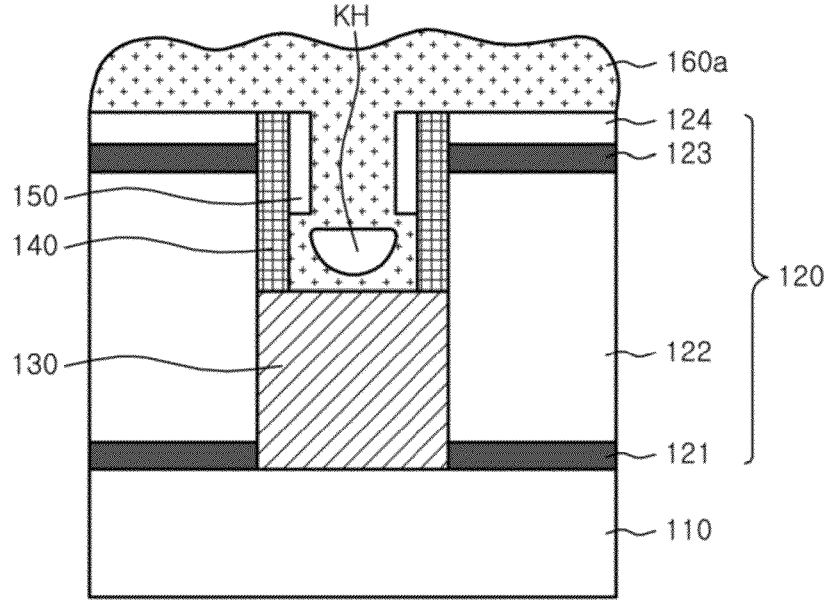

As illustrated in FIG. 5, a third spacer material 160a is deposited in the hole H. The third spacer material 160a may be nitride. The third spacer material 160a has a form protruding toward the center of the hole H, and thus the third spacer material 160a may not be easily buried. Therefore, the third spacer material 160a is formed in a state in which the third spacer material 160a is not completely buried in the hole H and a key hole pattern KH is formed in the hole H. The key hole pattern KH is generated by a physical shape of the hole H, and a size of the key hole pattern KH may be controlled according to a degree of protrusion of the second spacer 150, that is, according to a width of oxidation of the first spacer 140.

Figure 6:
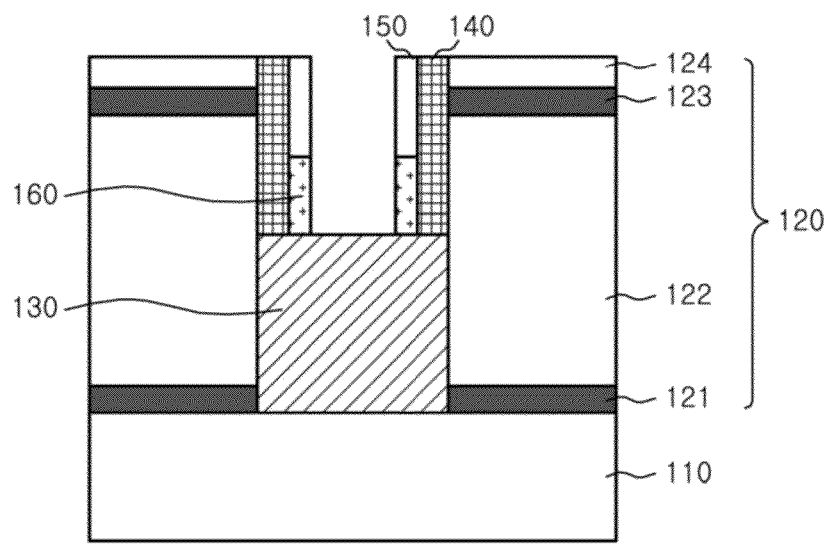

As illustrated in FIG. 6, only the third spacer material 160a is selectively etched to form a third spacer 160 on the lower electrode 130 and below the second spacer 150. At this time, the etching of the third spacer material 160a may be performed using a combination of $CH_3F$ gas and $O_2$ gas.

Figure 7:
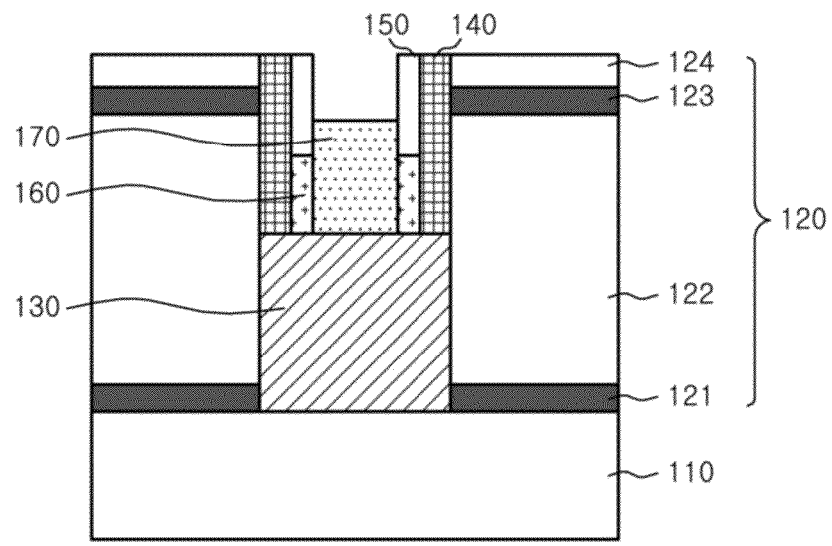

As illustrated in FIG. 7, a variable resistance material is deposited to be buried in the hole H. The variable resistance material 170 may be recessed to have a certain height, and thus a variable resistance part 170 having a height lower than that of the hole H may be formed. The variable resistance part 170 may include a phase-change material of which a resistance is changed depending on a crystalline state or an amorphous state according to a temperature, for example, $Ge_2Sb_2Te_5$ (GST).

Figure 8:
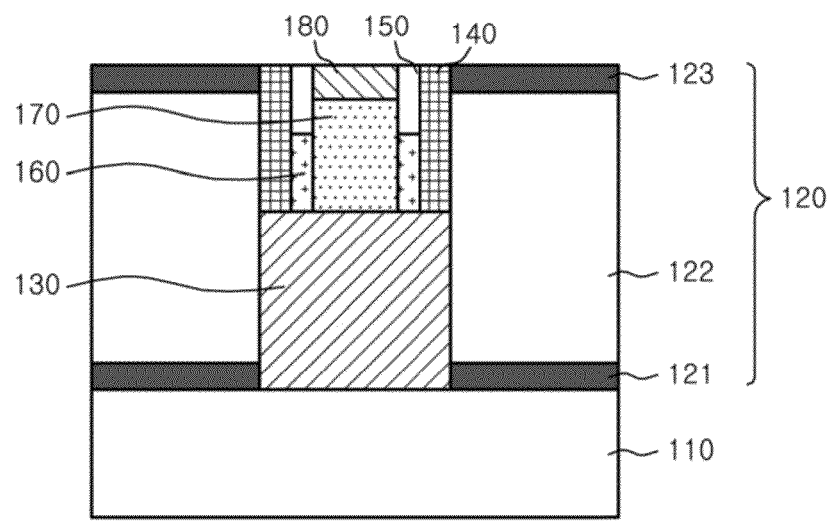

As illustrated in FIG. 8, an upper electrode material is deposited to be buried in the hole H, and then planarized to form an upper electrode 180. In the planarization process, the buffer nitride layer 123 among the insulating layer 120 may serve as an etching stopper layer to allow a height of a variable resistance cell to be maintained.

As described above, in the variable resistance memory device according to an embodiment of the inventive concept, since the lower electrode 130 and the variable resistance part 170 are in contact with each other through the key hole KH, a contact area may be reduced, and thus a reset current may be reduced.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a variable resistance memory device, the method comprising:
    forming a multi-layered insulating layer on a semiconductor substrate;
    forming a hole exposing a portion of an upper surface of the semiconductor substrate by etching the multi-layered insulating layer;
    forming a lower electrode in a bottom of the hole;
    forming a first spacer on the lower electrode and a sidewall of the hole;
    forming a second spacer on an upper sidewall of the first spacer;
    forming a third spacer on a lower sidewall of the first spacer;
    forming a variable resistance part in the hole to have a height lower than that of the hole; and
    forming an upper electrode on the variable resistance part to be buried in the hole.

2. The method of claim 1, wherein the multi-layered insulating layer includes:
    a first insulating layer formed on the lower electrode and formed of nitride;
    a second insulating layer formed on the first insulating layer and formed of oxide;
    a third insulating layer formed on the second insulating layer and formed of the nitride; and
    a fourth insulating layer formed on the third insulating layer and formed of the oxide.

3. The method of claim 2, wherein the fourth insulating layer is removed using the third insulating layer as an etch stopper layer in the forming of the upper electrode.

4. The method of claim 3, wherein the second spacer is formed by oxidizing the first spacer in the forming of the second spacer.

5. The method of claim 4, further comprising a sacrificial layer having a certain height in the hole after the forming of the first spacer.

6. The method of claim 5, further comprising removing the sacrificial layer after the forming of the second spacer.

7. The method of claim 6, wherein a height of the variable resistance part is formed to be higher than that of the third spacer in the forming of the variable resistance part.

8. A method of manufacturing a variable resistance memory device, the method comprising:
    forming a multi-layered insulating layer on a semiconductor substrate;
    forming a hole exposing a portion of an upper surface of the semiconductor substrate by etching the multi-layered insulating layer;
    forming a lower electrode in a bottom of the hole;
    forming a first spacer on the lower electrode and a sidewall of the hole;
    forming a second spacer protruded from an upper sidewall of the first spacer;
    depositing a third spacer material into the hole;
    forming a third spacer on a lower sidewall of the first spacer and below the second spacer by selectively etching the third spacer material; and
    forming a variable resistance part in the hole to have a height lower than that of the hole.

9. The method of claim 8, further comprising forming an upper electrode on the variable resistance part to be buried in the hole.

10. The method of claim 9, wherein the second spacer is formed by oxidizing the first spacer in the forming of the second spacer.

11. The method of claim 10, wherein the multi-layered insulating layer includes:
- a first insulating layer formed on the lower electrode and formed of nitride;
- a second insulating layer formed on the first insulating layer and formed of oxide;
- a third insulating layer formed on the second insulating layer and formed of the nitride; and
- a fourth insulating layer formed on the third insulating layer and formed of the oxide.

12. The method of claim 11, wherein the third spacer material is nitride.

* * * * *